United States Patent
Liu et al.

(10) Patent No.: US 9,014,230 B2
(45) Date of Patent: Apr. 21, 2015

(54) SINGLE-MODE QUANTUM CASCADE LASERS HAVING SHAPED CAVITIES

(75) Inventors: Qiang Liu, Princeton, NJ (US); Claire Gmachl, Princeton, NJ (US); Kamil Przemyslaw Sladek, Moenchengladbach (DE)

(73) Assignee: The Trustees of Princeton University, Princeton, NJ (US)

( * ) Notice: Subject to any disclaimer, the term of this patent is extended or adjusted under 35 U.S.C. 154(b) by 300 days.

(21) Appl. No.: 13/110,413

(22) Filed: May 18, 2011

(65) Prior Publication Data

US 2011/0286485 A1 Nov. 24, 2011

Related U.S. Application Data

(60) Provisional application No. 61/346,320, filed on May 19, 2010.

(51) Int. Cl.
*H01S 3/081* (2006.01)
*H01S 5/10* (2006.01)
*H01S 5/065* (2006.01)
*H01S 5/22* (2006.01)

(52) U.S. Cl.
CPC .............. *H01S 5/101* (2013.01); *H01S 5/0654* (2013.01); *H01S 5/1014* (2013.01); *H01S 5/22* (2013.01); *H01S 2301/02* (2013.01)

(58) Field of Classification Search
CPC ....................................................... H01S 5/101
USPC ....................................................... 372/92, 93
See application file for complete search history.

(56) References Cited

U.S. PATENT DOCUMENTS

| | | | | |
|---|---|---|---|---|
| 5,088,105 A | * | 2/1992 | Scifres et al. | 372/92 |
| 5,398,256 A | * | 3/1995 | Hohimer et al. | 372/94 |
| 6,243,516 B1 | * | 6/2001 | Seino | 385/47 |
| 6,542,529 B1 | * | 4/2003 | Hagberg et al. | 372/46.01 |
| 6,680,961 B2 | * | 1/2004 | Behfar | 372/94 |
| 6,914,924 B2 | * | 7/2005 | Granestrand et al. | 372/50.1 |
| 6,999,658 B2 | * | 2/2006 | Taghavi-Larigani et al. | 385/32 |
| 8,259,769 B1 | * | 9/2012 | Raring et al. | 372/44.011 |
| 2004/0218654 A1 | * | 11/2004 | Kneissl et al. | 372/94 |
| 2005/0169339 A1 | * | 8/2005 | Cumbo | 372/66 |

(Continued)

OTHER PUBLICATIONS

Fathpour et al., "Silicon-photonics-based wideband radar beamforming: basic design," Jan. 2010, Optical Engineering 49, 018201.*

(Continued)

*Primary Examiner* — Julio J Maldonado
*Assistant Examiner* — Joshua King
(74) *Attorney, Agent, or Firm* — McCarter & English, LLP

(57) ABSTRACT

Single-mode quantum cascade lasers having shaped cavities of various geometries are provided. The shaped cavities function as monolithic coupled resonators, and permit single-mode operation of the lasers. A folded or hairpin-shaped cavity could be provided, having a plurality of straight segments interconnected with a curved segment. Additionally, a shaped cavity could be provided having a single straight segment interconnected at one end to a curved segment. The curved segment could also be tapered in shape, such that the width of the curved segment decreases toward one end of the curved segment. A laser which includes a shaped cavity having two interconnected, folded shaped cavities is also provided.

30 Claims, 25 Drawing Sheets

(56) References Cited

U.S. PATENT DOCUMENTS

2006/0034576 A1* 2/2006 Merritt et al. .............. 385/129
2008/0267239 A1* 10/2008 Hall et al. ............ 372/46.013

OTHER PUBLICATIONS

Beck et al., "Continuous Wave Operation of a Mid-Infrared Semiconductor Laser at Room Temperature" 2002, Science, 295, 301-305.*

Swint et al., "Curved Waveguides for Spatial Mode Filters in Semiconductor Lasers," Jan. 2004, IEEE Photonics Tech Letters, vol. 16, No. 1, 12-14.*

"Single-Mode Quantum Cascade Lasers with Coupled-Cavities," poster publicly presented Mar. 2011 (1 page).

"Quantum Cascade Lasers with Ultra-Strong Coupling Injection," poster publicly presented Mar. 2010 (1 page).

Liu, et al., "Single-Mode Quantum Cascade Lasers with Monolithic Coupled-Cavities," presented at the 11$^{th}$ International Conference on Intersubband Transitions in Quantum Wells (2011) (3 pages).

Liu, et al., "Single-Mode Quantum Cascade Lasers Employing a Candy-Cane Shaped Fabry-Perot Cavity," 2011 Conference on Lasers and Electro-Optics: Laser Science to Photonic Applications, CLEO 2011 (2 pages).

Liu, et al., "Single-Mode Quantum Cascade Lasers with a Folded Fabry-Perot Resonator Waveguide," Lasers and Electro-Optics/Quantum Electronics and Laser Science Conference: 2010 Laser Science to Photonic Applications, CLEO/QELS 2010 (2 pages).

Liu, et al., "Highly Power-Efficient Quantum Cascade Lasers," Nature Phonics, vol. 4, Feb. 2010 (4 pages).

Liu, et al., "Single-Mode Quantum Cascade Lasers Based on a Folded Fabry-Perot Cavity," Applied Physics Letters 98 (2011) (3 pages).

* cited by examiner

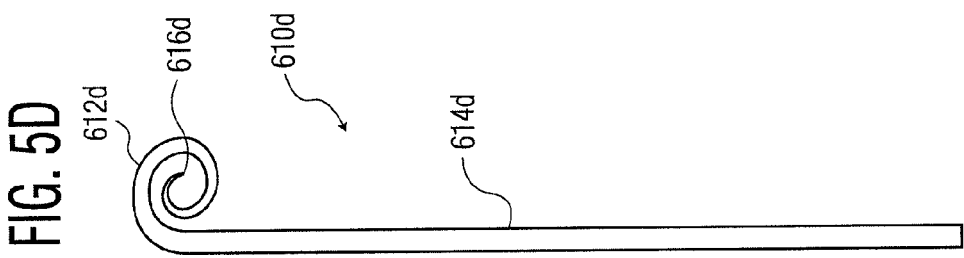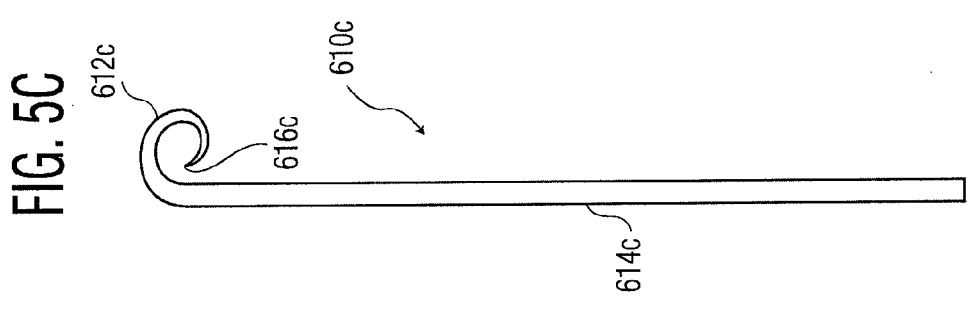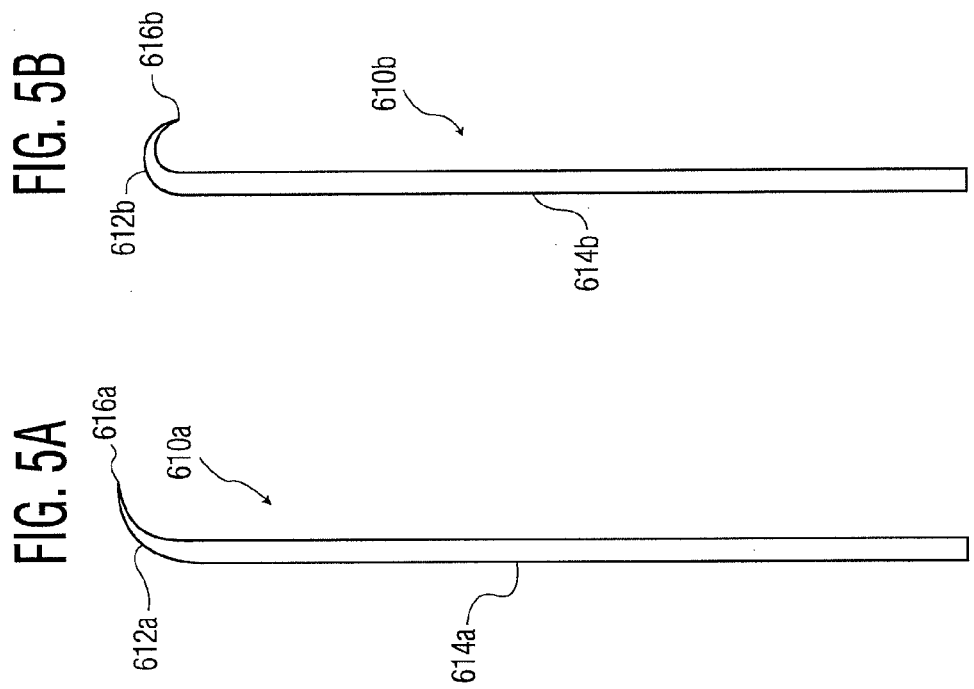

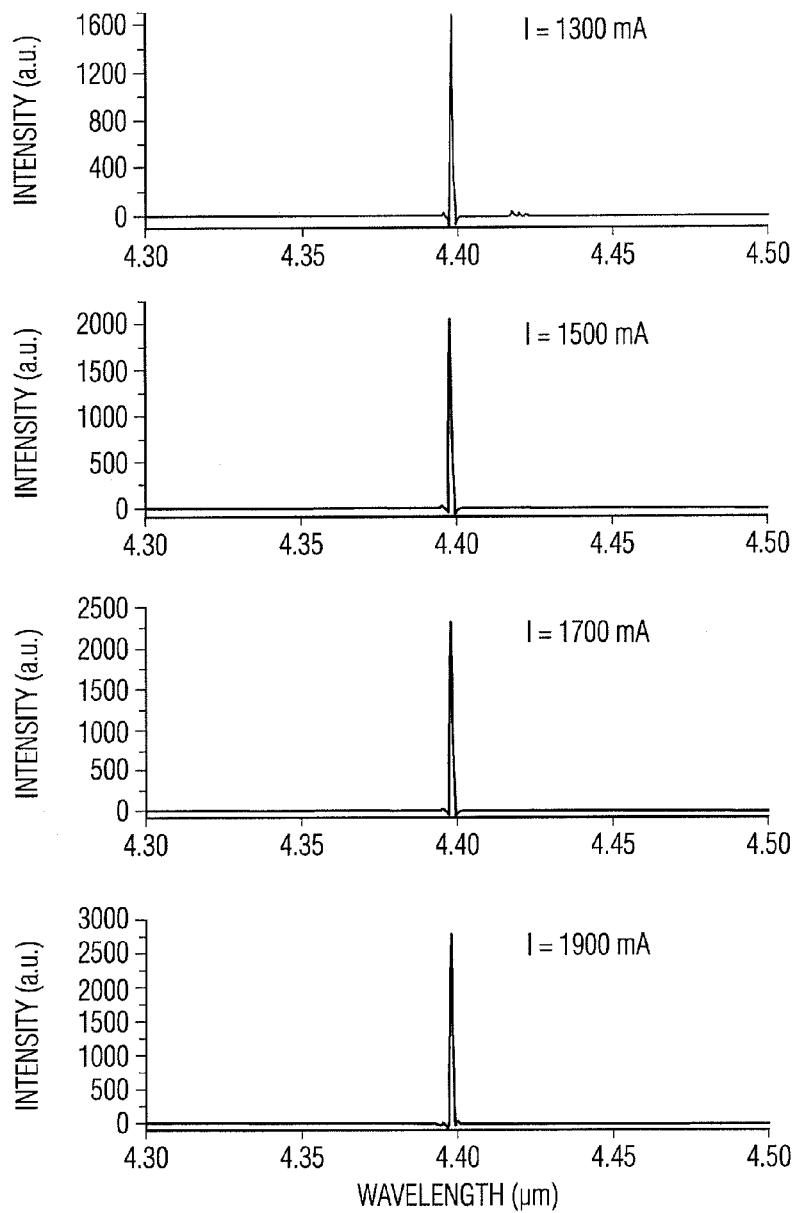

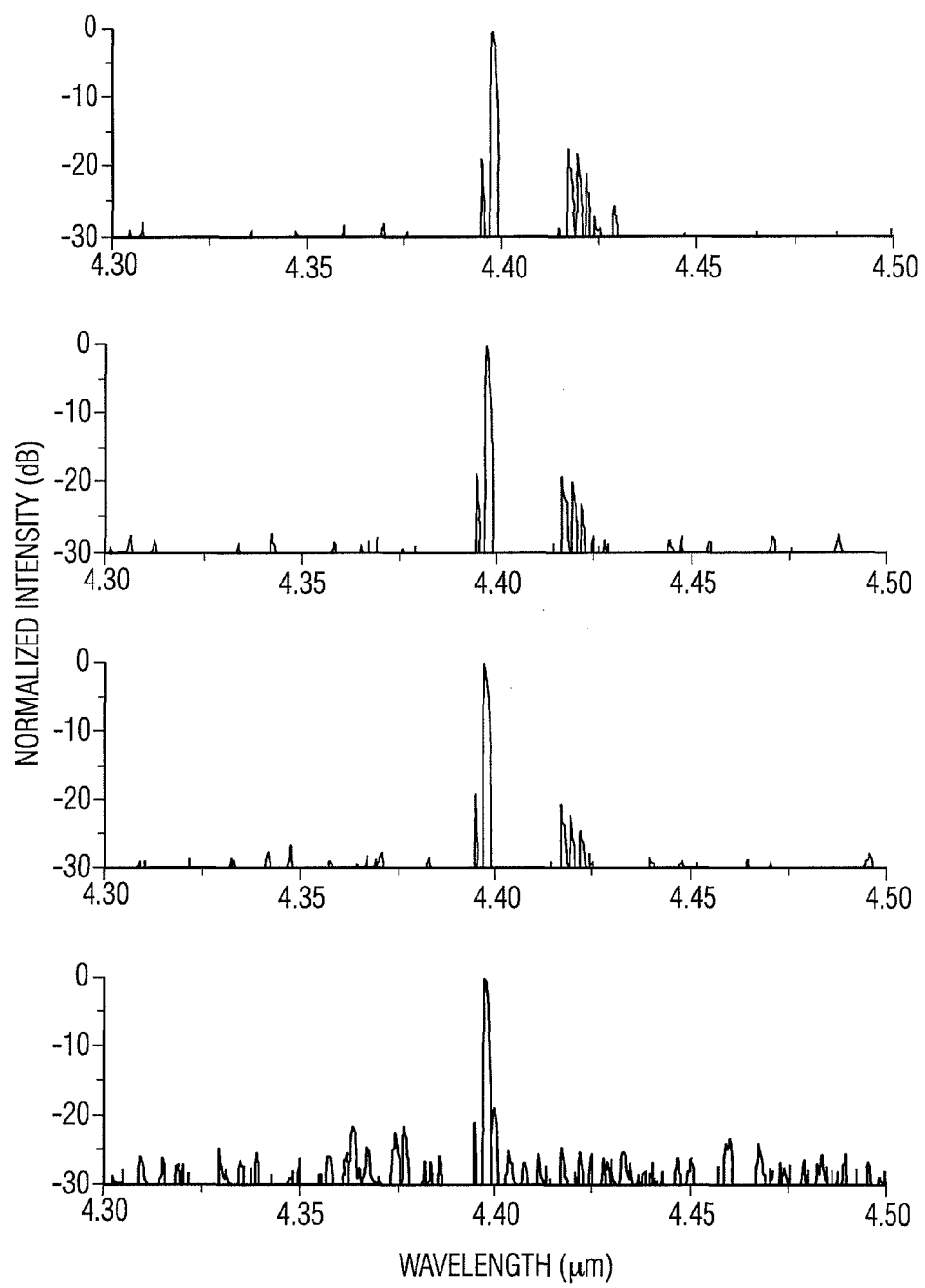

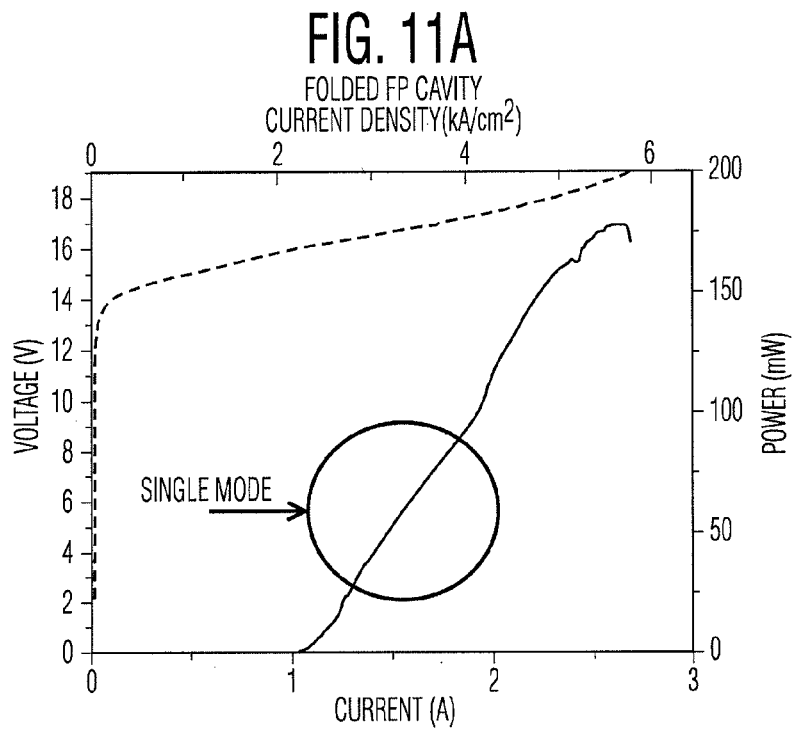
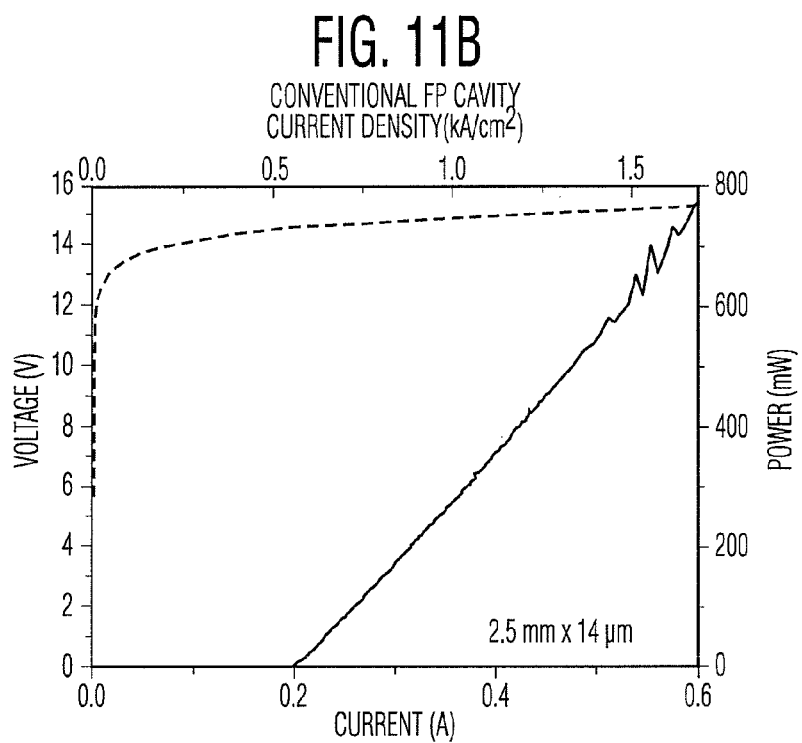

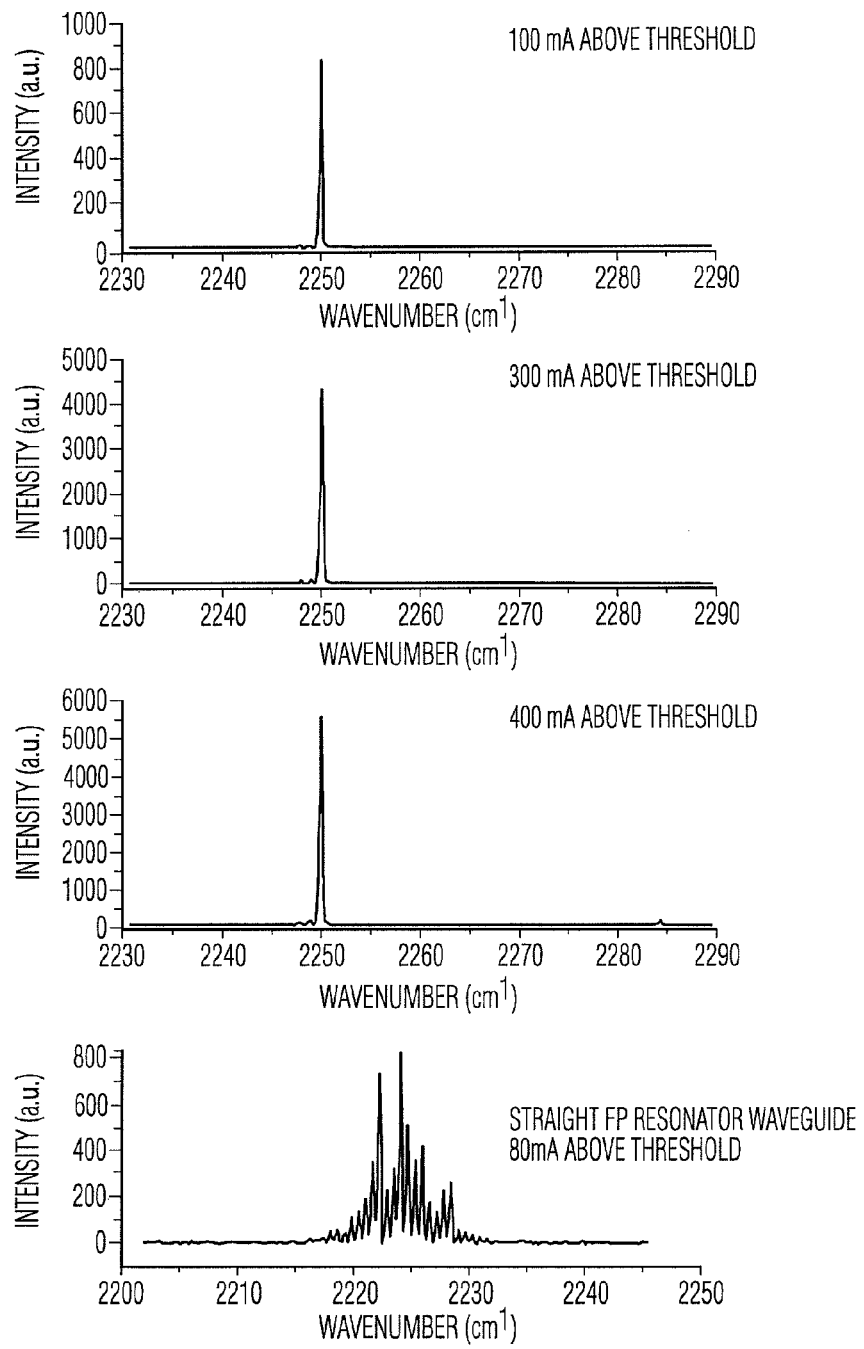

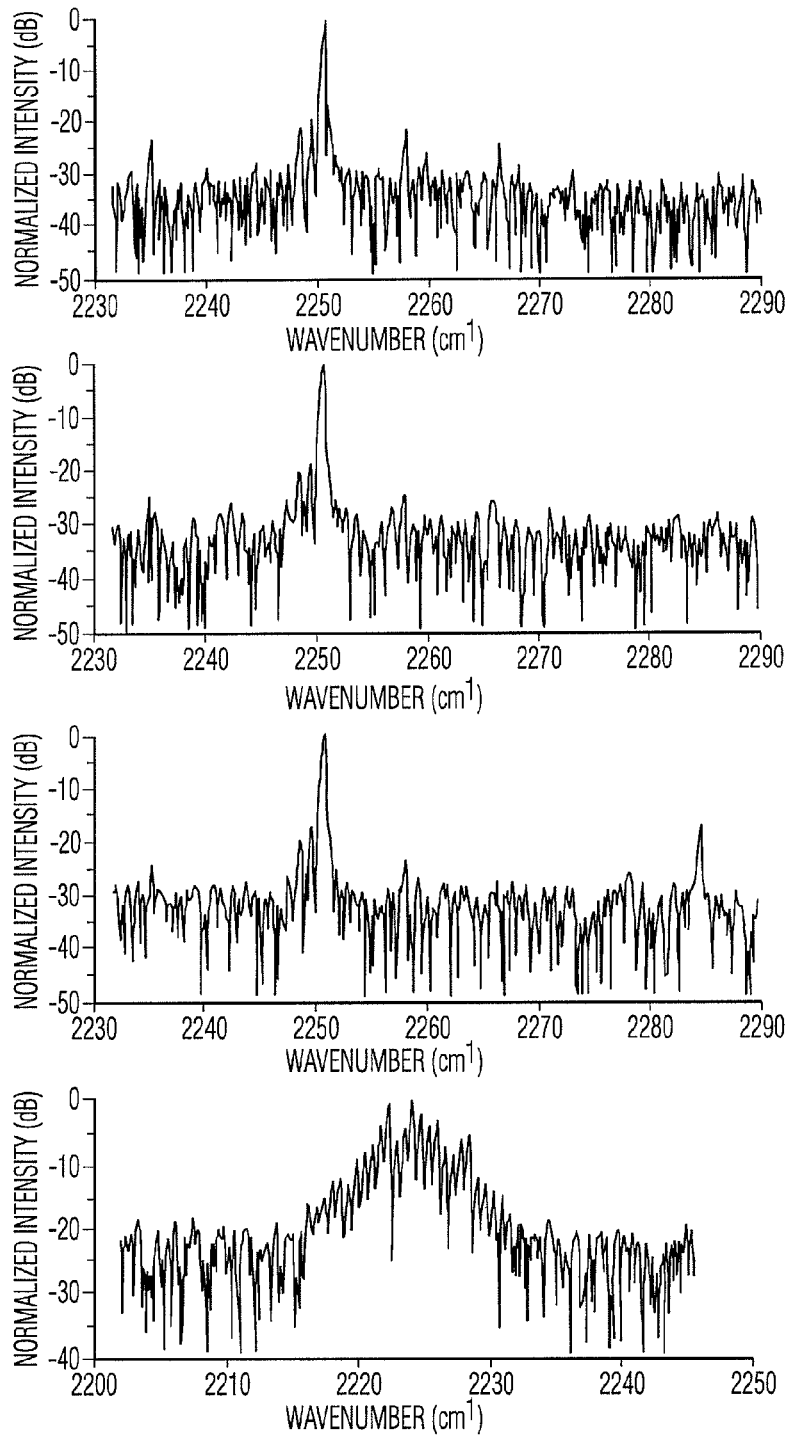

US 9,014,230 B2

SINGLE-MODE QUANTUM CASCADE LASERS HAVING SHAPED CAVITIES

RELATED APPLICATIONS

The present application claims the benefit of U.S. Provisional Application Ser. No. 61/346,320 filed May 19, 2010, the entire disclosure of which is expressly incorporated herein by reference.

STATEMENT OF GOVERNMENT INTERESTS

The present invention was made with government support under National Science Foundation Grant No. EEC-0540832. Accordingly, the Government has certain rights to the present invention.

BACKGROUND OF THE INVENTION

1. Field of the Invention

The present invention relates generally to the field of semiconductor lasers. More specifically, the present invention relates to single-mode quantum cascade lasers having shaped cavities.

2. Related Art

Quantum cascade (QC) lasers are mid-infrared (mid-IR) laser light sources fabricated from semiconductor (epitaxial) materials. QC lasers are useful in a number different applications, such as molecular detection, environmental trace gas sensing, medical diagnostics, etc. QC lasers are unipolar, and laser emission is achieved through the use of intersubband transitions present in alternating stacks of semiconductor materials.

It is possible to operate QC lasers in so-called "single mode," wherein the device emits laser light of a single wavelength. Single-mode operation of QC lasers is usually achieved by either integrating distributed feedback (DFB) Bragg gratings into the laser cavity, or by making use of macroscopic gratings in an external cavity (EC) configuration. However, both approaches require complicated fabrication and/or coating processes. EC-QC lasers also require high-precision alignments, therefore the cost for single-mode QC lasers is much higher than that of the simple ridge lasers.

It is known to fabricate QC lasers with resonant waveguides. For example, QC lasers have been fabricated with ridge waveguides such as straight Fabry-Perot (FP) resonators. Such straight FP waveguides/resonators generally operate in multiple longitudinal modes, and therefore are generally not suitable for single-mode applications.

SUMMARY OF THE INVENTION

The present invention relates to single-mode quantum cascade lasers having shaped cavities of various geometries. The shaped cavities function as monolithic coupled cavity resonators, and permit single-mode operation of the lasers. In one embodiment, the laser includes a folded or hairpin shaped cavity having a plurality of straight segments interconnected with a curved segment. The curved segment could have a constant width or a flat inner wall. The straight segments could include inner or outer tapered walls. In another embodiment, the laser includes a shaped cavity having a single straight segment interconnected at one end to a curved segment. The curved segment could be curved to any desired degree (e.g., 360 degrees, 180 degrees, 90 degrees, etc.), and could also be spiral shaped. The curved segment could also be tapered in shape, such that the width of the curved segment decreases toward one end of the curved segment. In another embodiment, the laser includes a shaped cavity having two interconnected, folded shaped cavities.

BRIEF DESCRIPTION OF THE DRAWINGS

The foregoing features of the invention will be apparent from the following Detailed Description of the Invention, taken in connection with the accompanying drawings, in which:

FIG. 5A-5D are diagrams illustrating additional embodiments of the laser of the present invention, wherein cavities are provided having a single straight portion and tapered, curved portions of various geometries.

FIGS. 7A-15B are graphs showing performance characteristics of lasers of the present invention.

DETAILED DESCRIPTION OF THE INVENTION

The present invention relates to single-mode quantum cascade lasers having shaped cavities, as discussed in detail below in connection with FIGS. 1-15B. It is noted that, while the structures discussed herein relate to quantum cascade lasers, it is possible that such structures could also be implanted to form lasers of other types (e.g., diode lasers).

Figure 1:
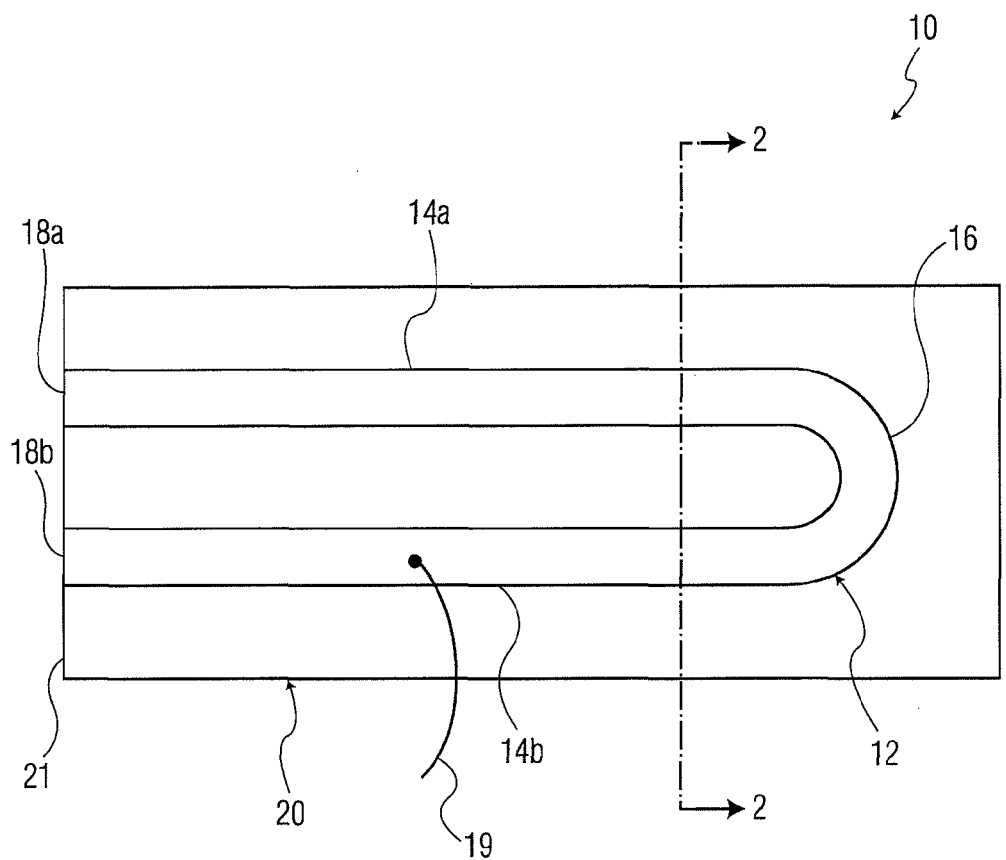
FIG. 1 is a top view illustrating one embodiment of the laser of the present invention, wherein a folded cavity is provided.

FIG. 1 is a top view of the laser 10 of the present invention. The laser 10 includes a folded Fabry-Perot (FP) resonator cavity or waveguide 12 having two parallel, straight segments (ridges) 14a, 14b and a curved or bended (e.g., half-ring) segment 16 connecting the straight segments 14a, 14b. The straight segments 14a, 14b terminate at cleaved ends 18a, 18b formed along an edge 21. Laser light is emitted from the cleaved ends 18a, 18b, which function as facets for the laser 10, through which laser light is emitted. The cavity 12 is formed on a substrate 20. A top electrical contact 19 is attached to the cavity 12, and a second contact (not shown) is attached to the bottom surface of the substrate 20. As discussed in greater detail below, the cavity 12 is formed from an epitaxial structure. The lengths of the straight segments 14a, 14b are determined by the location at which they are cleaved. For example, lengths of approximately 1.2 mm could be chosen to match lengths of typical straight FP resonator waveguides of QC lasers. Other suitable lengths which result in single-mode operation could also be used.

The inner diameter of the curved segment 16 could vary, e.g., from 25 µm to 100 µm (or other size) with a step size of 25 µm, for example. The widths of the curved segment 16 and the straight segments 14a, 14b could be any desired width, e.g., approximately 18.5 µm. Single-mode emission from the laser 12 can be achieved in pulsed mode operation yielding, e.g., up to approximately 400 mA above threshold current, up to approximately 1.8 times threshold current, and/or an additional 80% above threshold current, at a temperature of 80 K with a side-mode suppression ratio (SMSR) of approximately 20 dB. Further, tunable and single-mode emission can be achieved in pulsed mode operation with an SMSR of up to 27 dB, with large operating current ranges of up to 60% above threshold current and tuning ranges of over 40 cm$^{-1}$ by changing ridge length and over 15 cm$^{-1}$ by changing operating temperature.

The folded FP resonator waveguide 12 can be considered to be a hairpin- or half-racetrack-shaped coupled cavity consisting of the two straight FP segments 14a, 14b and the curved segment 16. The curved segment 16 functions as a highly selective mode filter. The modes in the curved segment 16 are so-called "whispering gallery" modes. Thus, the free spectral range of the cavity 12 is significantly increased compared to that of a straight FP resonator of similar length. The laser 10 has an emission wavelength of, for example, approximately 4.5 μm, but other wavelengths can be achieved (e.g., by altering the gain material utilized in the device) provided that single-mode emission occurs. Since the propagating modes in the straight sections and the half-ring section are different, they experience different modal refractive indices, and therefore reflection takes place at locations where different propagation modes from neighboring sections couple into each other. The three sections, though having no physical boundaries therebetween, can be seen as individual cavities and together form a monolithic coupled cavity, which enhances the mode selectivity.

Figure 2:
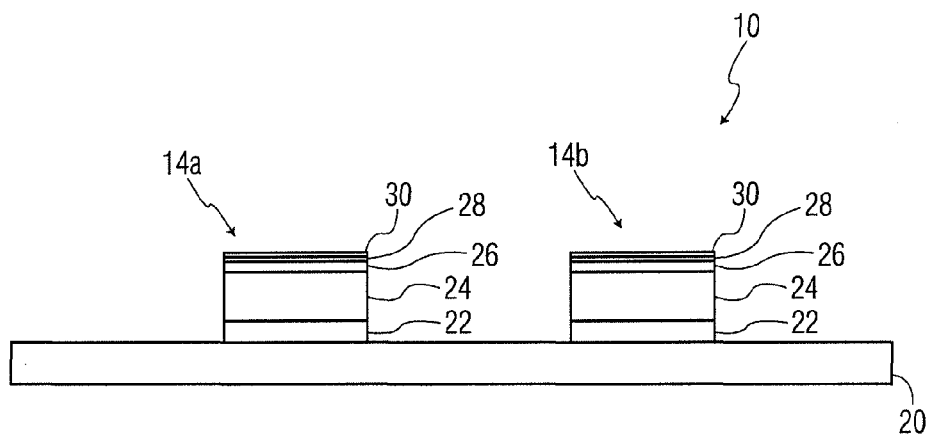
FIG. 2 is a cross-sectional view taken along the line 2-2 of FIG. 1.

FIG. 2 is a cross-sectional view taken along the line 2-2 of FIG. 1. The laser 10 is formed on a substrate 20, which could include a buffered Indium Phosphide (InP) substrate layer having a grading layer formed thereon. The grading layer could be formed from alternating layers of Indium Gallium Arsenide (InGaAs) and Aluminum Indium Arsenide (AlIn As). Alternatively, the layers of InGaAs could be substituted with Indium Aluminum Arsenide (InAlAs). The straight segments 14a, 14b and the curved segment 16 are formed from a plurality of epitaxial layers 22-30 formed on the substrate 20. Layer 22 comprises the active layer (injector region) of the laser 10, and could be formed from alternating layers of InGaAs and AlInAs. The InGaAs layers could be substituted with layers of InAlAs. The layer 24 comprises an InP cladding layer formed on top of the active layer 22. Layer 26 comprises a highly-doped InP layer formed on the cladding layer 24. Layer 28 is a top InP contact layer, and layer 30 is a top InGaAs contact formed on the contact layer 28.

The laser 10 shown in FIGS. 1-2 could be fabricated employing standard III-V semiconductor fabrication techniques. The ridges of the cavity 12 could be etched through the epitaxial layer to a height of approximately 7.5 μm and a width of approximately 18.5 μm, and SiO$_2$ (3000 Å) could be deposited on the side-walls for electrical insulation. The device could be thinned to approximately 200 μm and top Ti/Au (300/3000 Å) and bottom Ge/Au (300/3000 Å) contacts could be applied. Devices with various half-ring diameters could be cleaved to approximately 1.2 mm in length and mounted epitaxial side up to copper heat sinks. Such fabrication techniques are identical to that of typical straight FP resonator waveguide lasers. Of course, other dimensions (e.g., heights and widths) of the device are possible.

FIGS. 3A-3D are top views illustrating additional embodiments of the laser of the present invention (indicated as lasers 110, 210, 310, and 410, respectively), wherein a single straight segment is provided in each embodiment and curved segments of various shapes are provided. As discussed below, the laser cavity could be shaped similar to a candy cane. The lasers shown in FIGS. 3A-3D could be fabricated using epitaxial materials and techniques similar to those used for the laser 10 of FIGS. 1-2, i.e., the folded FP cavities could be patterned by photolithography and wet etched through the epitaxial layer with approximately 8 μm in height and approximately 18 μm in width; SiO2 (3000 Å) could then deposited using plasma-enhanced chemical vapor deposition for electrical insulation; contact windows on top of the entire structure could then be opened using reactive-ion etching; and the devices could be thinned to approximately 200 μm and top Ti/Au (300/3000 Å) and bottom Ge/Au (300/3000 Å) contacts could deposited by electron beam evaporation. Devices with different spiral structures and various straight ridge lengths could cleaved to form the facet and mounted epitaxial side up or down to copper heat sinks.

Figure 3A:
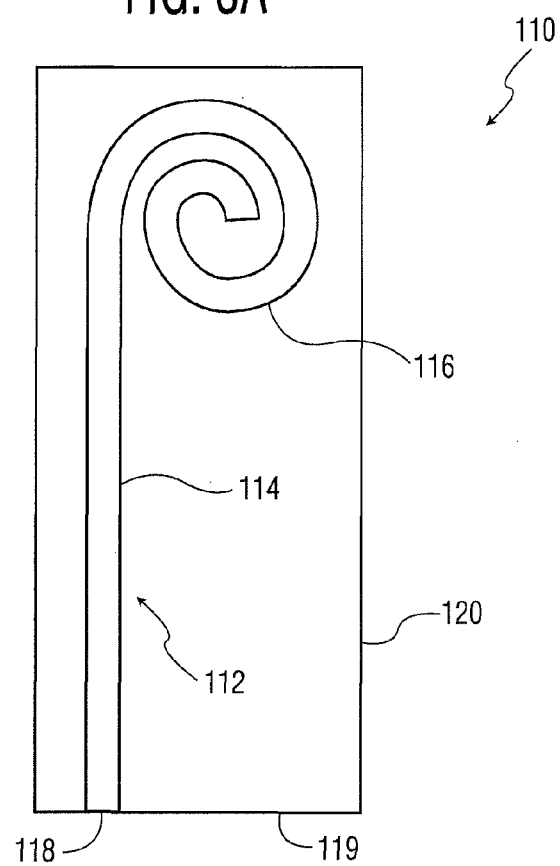
FIGS. 3A-3D are top views illustrating additional embodiments of the laser of the present invention, wherein cavities are provided having a single straight portion and curved portions of various geometries.

The laser 110 shown in FIG. 3A includes a cavity 112 formed on a substrate 120. The cavity 112 includes a single straight segment 114 having a spiral, curved segment 116 connected to an end thereof. A cleaved end 118 opposite the segment 114 is formed at an edge 119 of the substrate 120, and laser light is emitted from the end 118. The spiral segment 116 could be curved 540 degrees, and could be formed from three half-ring structures connected together.

Figure 3B:
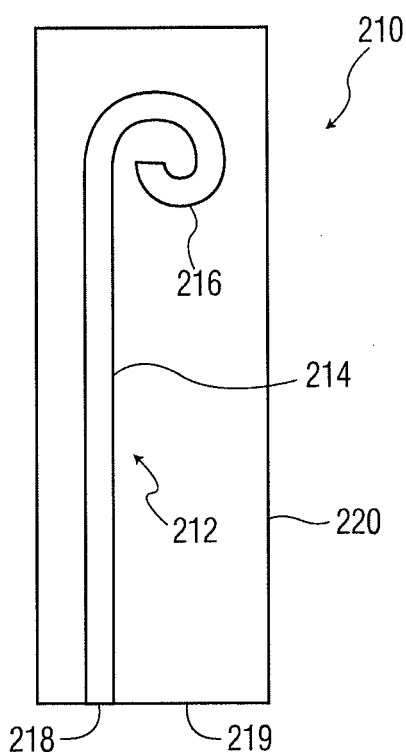

The laser 210 shown in FIG. 3B includes a cavity 212 formed on a substrate 220. The cavity 212 includes a single straight segment 214 having a spiral, curved segment 216 connected to an end thereof. A cleaved end 218 opposite the segment 214 is formed at an edge 219 of the substrate 220, and laser light is emitted from the end 218. The spiral segment 216 could be curved 360 degrees, and could be formed from two half-ring structures connected together.

Figure 3C:
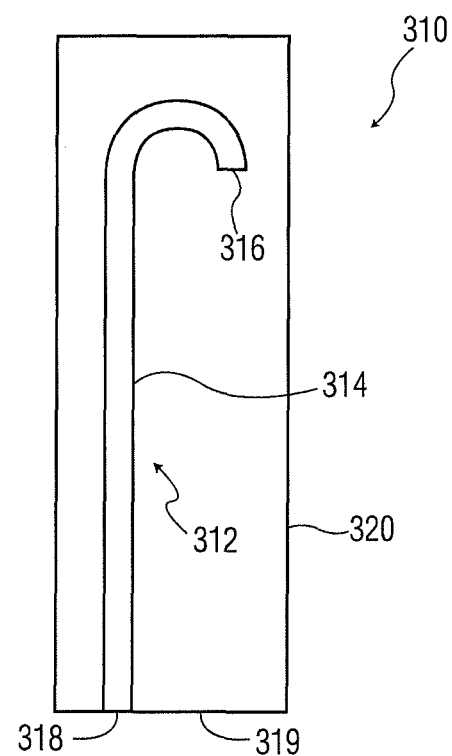

The laser 310 shown in FIG. 3C includes a cavity 312 formed on a substrate 320. The cavity 312 includes a single straight segment 314 having a curved segment 316 connected to an end thereof. A cleaved end 318 opposite the segment 314 is formed at an edge 319 of the substrate 320, and laser light is emitted from the end 318. The curved segment 316 could be curved 180 degrees, and could be formed from a single half-ring structure.

Figure 3D:
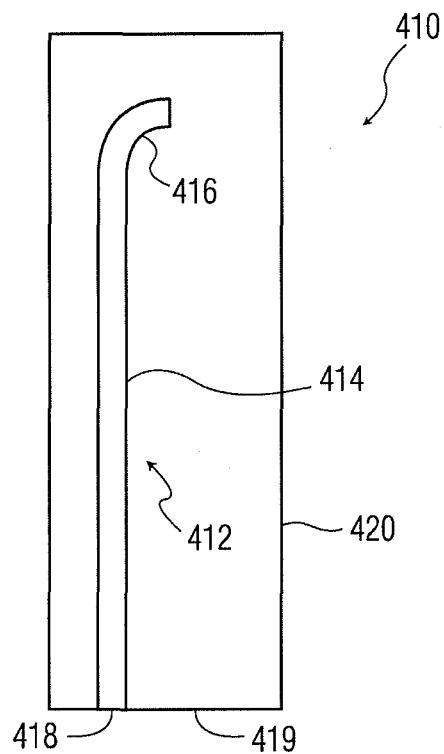

The laser 410 shown in FIG. 3D includes a cavity 412 formed on a substrate 420. The cavity 412 includes a single straight segment 414 having a curved segment 416 connected to an end thereof. A cleaved end 418 opposite the segment 414 is formed at an edge 419 of the substrate 420, and laser light is emitted from the end 418. The curved segment 416 could be curved 90 degrees.

The lasers 110, 210, 310, and 410 could be fabricated using a variety of geometries. Sample geometries are listed in Table 1, below:

TABLE 1

| | Geometry 1 | Geometry 2 | Geometry 3 | Geometry 4 |
|---|---|---|---|---|
| 540° spiral | 175/125/75 | 175/105/55 | | |
| 360° spiral | 105/75 | 105/55 | | |
| 180° spiral | 125 | 105 | 75 | 65 |
| 90° spiral | 125 | 105 | 75 | 65 |

In the above table, cavity geometries of four different spiral structures are shown. The numbers represent the diameters of the individual half-ring sections (in μm) from the outer part of the spiral toward the inner part of the spiral. Of course, other geometries and dimensions can be used provided that single-mode emission occurs. The lengths of the straight segments 114, 214, 314, and 414 could vary from 1.2 mm to 1.8 mm, and other lengths can be used provided that single-mode emission occurs. It is noted that the candy-cane shaped FP cavity can be considered to be a monolithic coupled-cavity between the straight ridge cavity and the spiral cavity, while the spiral cavities with 540 and 360 degree turns can be considered to be coupled-cavities themselves. Due to their much smaller dimensions compared with the straight ridges, the spiral cavities function as highly selective mode filters. Therefore, the spacing between the neighboring cavity modes of this coupled-cavity is significantly increased compared with that of conventional FP cavities of similar length.

Figure 4:
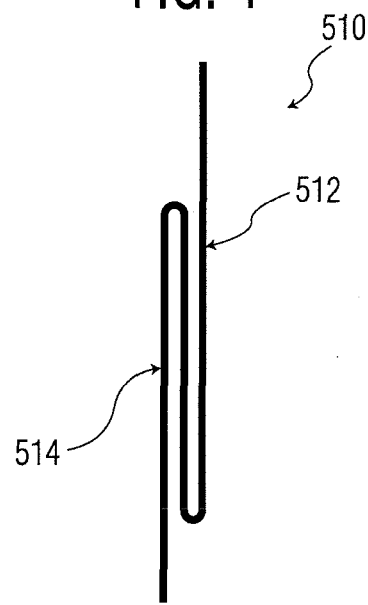
FIG. 4 is a diagram illustrating another embodiment of the laser of the present invention, wherein two folded cavities are provided.

FIG. 4 is a top view illustrating another embodiment of the laser of the present invention (indicated generally at 510), wherein two folded cavities 512, 514 are provided. Laser light can be emitted from one, or both, of the ends of the folded cavities 512, 514.

FIGS. 5A-5D are top views illustrating additional embodiments of the laser of the present invention (indicated generally as lasers 610a-610d), wherein tapered, shaped cavities of various geometries are provided. Although specific curvatures (expressed in degrees) are shown and discussed, it is to be understood that other degrees of curvature can be employed so long as single-mode emission results.

As can be seen in FIG. 5A, the laser 610a includes a single, straight cavity portion 614a interconnected with a tapered, curved portion 612a that is curved 90 degrees. The taper begins at one end of the curved portion 612a (where the curved portion 612a meets the straight portion 614a), continues so that the width of the curved portion 612a decreases uniformly along the curved portion 612a, and terminates at a point 616a.

As can be seen in FIG. 5B, the laser 610b includes a single, straight cavity portion 614b interconnected with a tapered, curved portion 612b that is curved 180 degrees. The taper begins at one end of the curved portion 612b (where the curved portion 612b meets the straight portion 614b), continues so that the width of the curved portion 612b decreases uniformly along the curved portion 612b, and terminates at a point 616b.

As can be seen in FIG. 5C, the laser 610c includes a single, straight cavity portion 614c interconnected with a tapered, curved portion 612c that is curved 360 degrees. The taper begins at one end of the curved portion 612c (where the curved portion 612c meets the straight portion 614c), continues so that the width of the curved portion 612c decreases uniformly along the curved portion 612c, and terminates at a point 616c.

As can be seen in FIG. 5D, the laser 610d includes a single, straight cavity portion 614d interconnected with a tapered, curved portion 612d that is curved 540 degrees. The taper begins at one end of the curved portion 612d (where the curved portion 612d meets the straight portion 614d), continues so that the width of the curved portion 612d decreases uniformly along the curved portion 612d, and terminates at a point 616d.

Figure 6A:
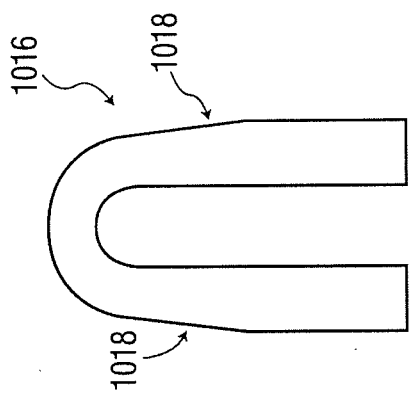
FIGS. 6A-6D are diagrams illustrating various possible shapes of the curved segments and portions of the straight segments of the cavities of the present invention.
Figure 6B:
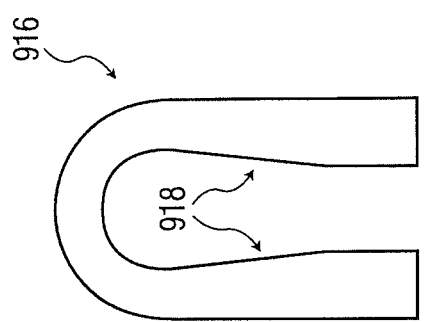
Figure 6C:
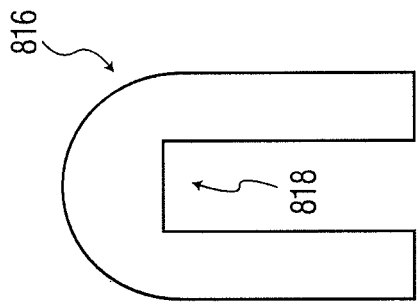
Figure 6D:
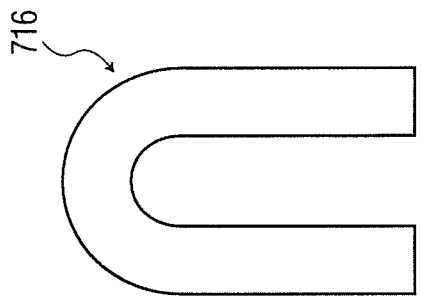

FIGS. 6A-6D are diagrams illustrating various possible shapes for the curved portions (segments) of the cavities of the lasers of the present invention. As shown in FIG. 6A, a curved portion 716 having a constant width could be provided. Alternatively, as shown in FIG. 6B, a curved portion 816 having a flat inner wall 818 could be provided. Still further, as shown in FIG. 6C, a curved portion 916 is provided, and portions of the straight segments (proximal to the curved portion 916) include tapered inner walls 918. In this arrangement, ridge modes are pushed outward. Moreover, as shown in FIG. 6D, a curved portion 1016 is provided, and portions of the straight segments (proximal to the curved portion 1016) include tapered outer walls 1018. In this arrangement, whispering gallery modes are pushed inward.

FIGS. 7A-15B are graphs showing various performance characteristics of the lasers of the present invention. These will now be discussed in detail.

FIGS. 7A-7D are graphs showing performance characteristics of lasers fabricated in accordance with the geometry shown in FIG. 1 and described herein. To obtain the results shown in FIGS. 7A-7D, laser spectra were measured with a Fourier transform infrared spectrometer. The lasers were operated in pulsed mode with pulse width of 15 ns and a repetition rate of 80 kHz. A number of lasers with various half-ring diameters and ridge lengths were characterized at 80 K to determine the single mode yield (with 15 dB SMSR as the benchmark for single mode emission). Several lasers were also characterized at various temperatures to investigate the temperature tuning effect. Single-mode emission was achieved for all the different half-ring diameters.

Figure 7A:
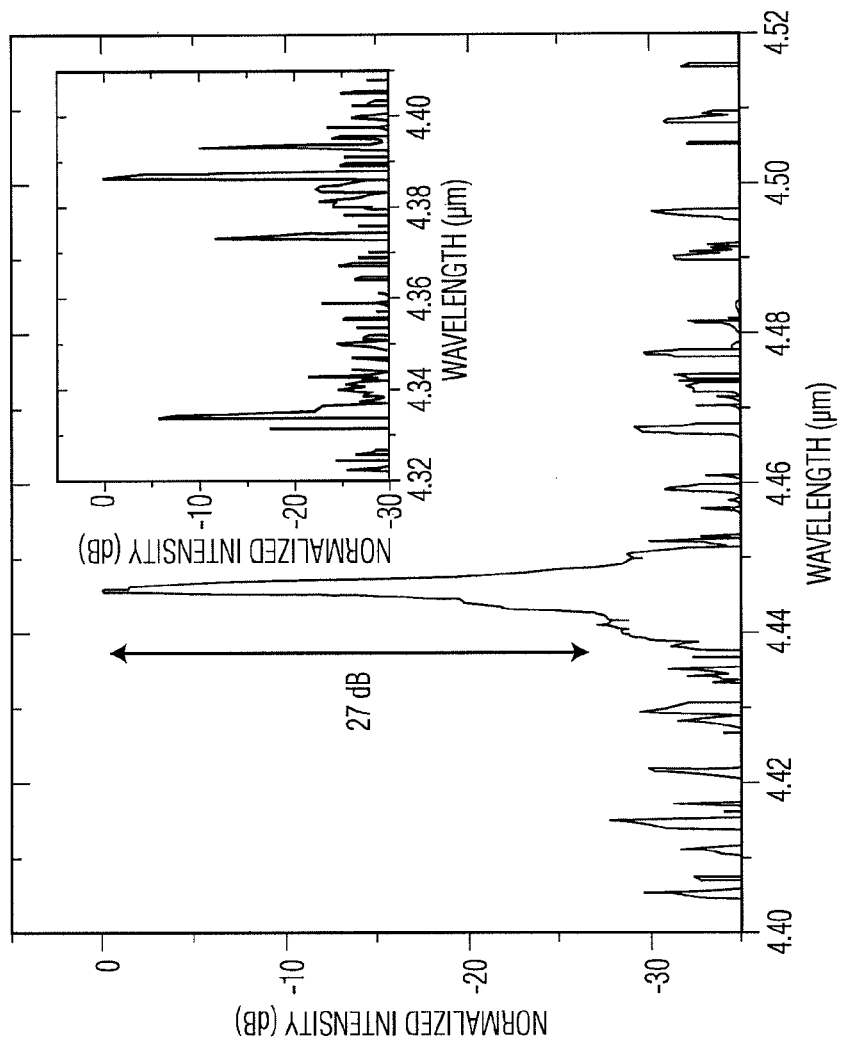

FIG. 7A shows in logarithmic scale the normalized spectrum of a laser with half-ring diameter of 100 μm and straight ridge length of 1.18 mm when operated at 80 K in pulsed mode. The lasers emitted in single mode up to approximately 400 mA above threshold current ($I_{th}$=1.15 A) with an SMSR of up to 27 dB, and the emission wavelength is at the peak (2240 cm$^{-1}$) of the electroluminescence measured at the same current density (2.5 kAcm$^{-2}$). Most of the single mode lasers show at least 100 mA single-mode operating current range at 80 K (the threshold current ranges from 1.0 to 1.5 A for most lasers); one of them has an approximately 800 mA single-mode operating current range and two others show approximately 600 mA. The lasers that are not single mode generally have only a few modes with large and irregular mode spacings, which vary within the approximately 4-20 cm$^{-1}$ range (see the spectrum in the inset of FIG. 7A). Such irregularity in mode spacing can also be attributed to the existence of higher order transverse modes in the cavity. The dense mode distribution resembling that of conventional FP cavity ridge lasers is observed only in 5 out of 75 tested lasers. Regardless of straight ridge length, 23 out of 41 tested lasers with the smallest half-ring diameter (50 μm) operate in single mode, and 4 out of 14 tested lasers with the second smallest half-ring diameter (75 μm) operate in single mode. However, the single-mode yield is lower for lasers with larger half-ring diameters (100 and 125 μm). Devices with smaller half-ring diameters (50 and 75 μm) on average also show larger single-mode operating current range than devices with larger half-ring diameters (100 and 125 μm). For most sensing applications it is important that the emission wavelength of the single-mode QC lasers can accurately hit the desired target and is tunable around it. For these folded FP cavity lasers, such a requirement can be met with the combination of tailoring the length of the straight ridges and tuning the operating temperature, respectively. The emission wavelength is dependent on the threshold condition, which in turn is closely related to the straight ridge length.

Figure 7B:
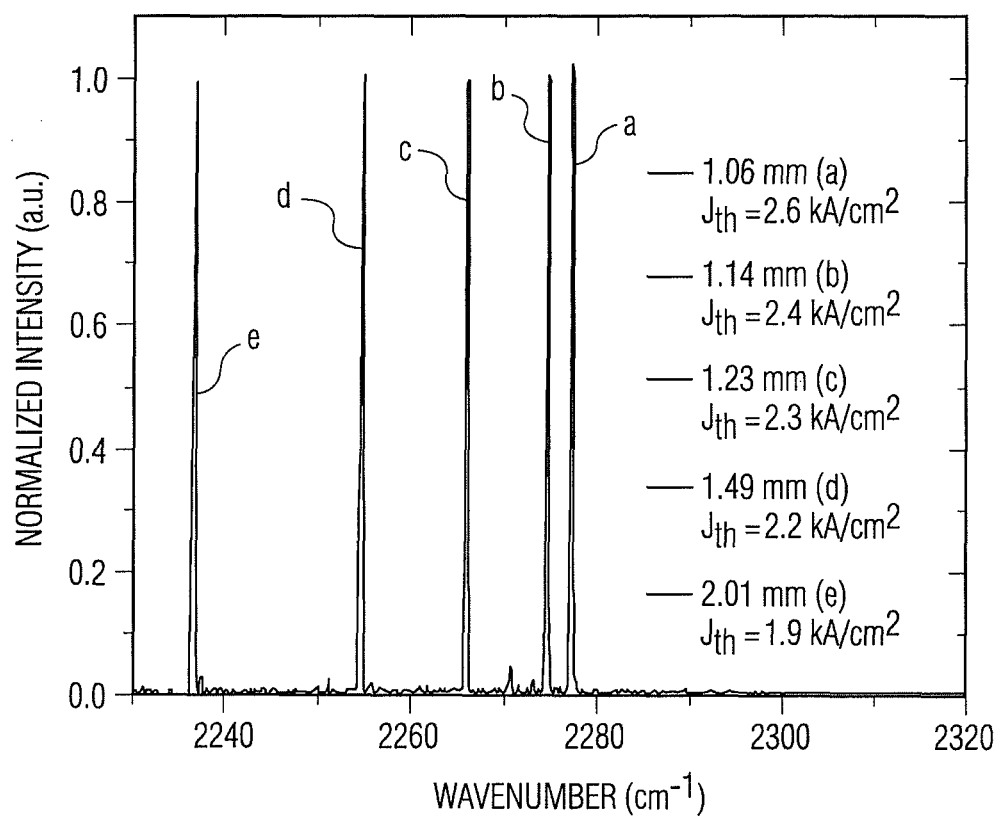

FIG. 7B shows the single-mode spectra of five lasers with the same half-ring diameter but with different straight ridge lengths. By tailoring the straight ridge length from approximately 1 to approximately 2 mm, the threshold current density is tuned from 2.6 to 1.9 kAcm$^{-2}$ and approximately 40 cm$^{-1}$ emission wavelength shift is achieved. However, this wavelength shift is faster than the tuning of the gain spectrum with current density (15 cm$^{-1}$/kA), because it is a combined effect of both gain tuning and the change in the cavity mode distribution.

Figure 7C:
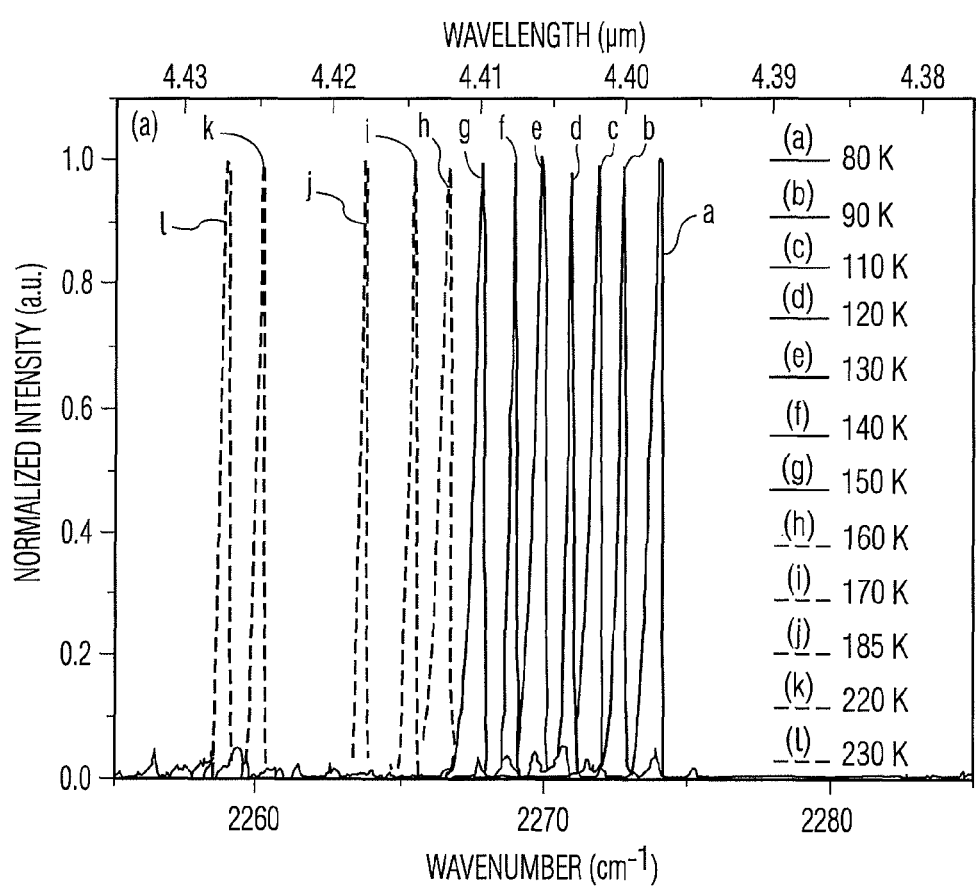
Figure 7D:
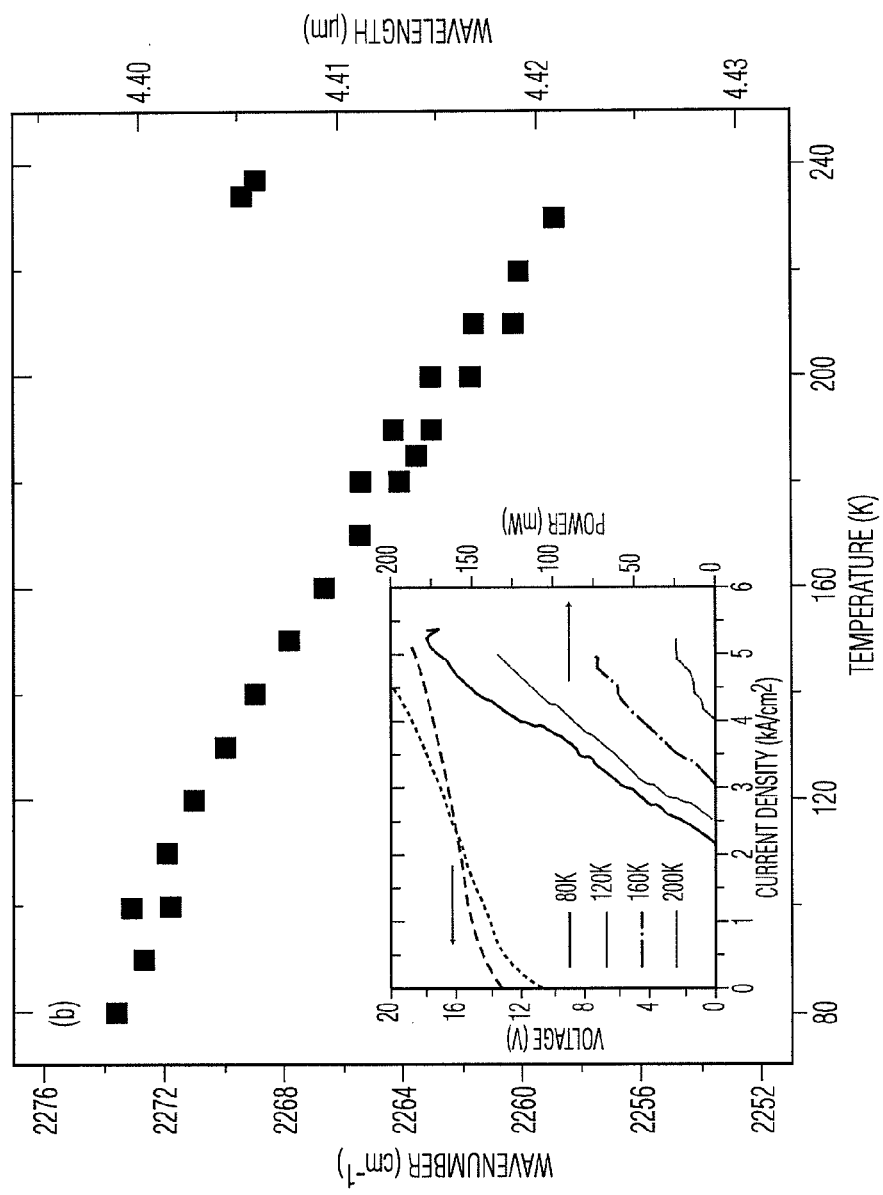

FIG. 7C shows the spectra of a laser at various operating temperatures and FIG. 7D plots the emission wavelength versus temperature within the range from 80 to 237 K. More than 15 cm$^{-1}$ overall tuning range was achieved. The laser operates in single mode within a large part of the whole tuning range, and a maximum continuous single-mode tuning range of approximately 7 cm$^{-1}$ is achieved from 110 to 170 K. At several temperatures where the laser is not single mode, the mode spacing between the two coexisting lasing modes is approximately 1.3 cm$^{-1}$ and corresponds to the free spectral range (FSR) of an FP cavity with length of the straight section (1.14 mm). Such a mode behavior again suggests that the folded FP cavity indeed functions as a coupled-cavity system. The threshold current density of these folded FP cavity lasers is about three to five times that of the conventional FP ridge lasers fabricated from the same wafer and comparable in total length, and their slope efficiency is also significantly lower (the insert in FIG. 7D shows the light-current-voltage (LIV) measurement of the laser). The lasers can be fabricated without depositing metal onto the outer sidewall of the half-ring section, and in such circumstances, it has been observed that there is only slightly lower threshold current density, which suggests that the additional waveguide loss introduced by the whispering gallery modes in the half-ring section penetrating more into the outer sidewall metal is also not significant. It is believed that the higher threshold can be attributed to insufficient adiabatic coupling between the modes in the straight ridge sections and the modes in the half-ring section and subsequent scattering into the substrate. Nevertheless, it is anticipated that the mode coupling can be improved by modifying the geometry of the bending section.

Figure 8:
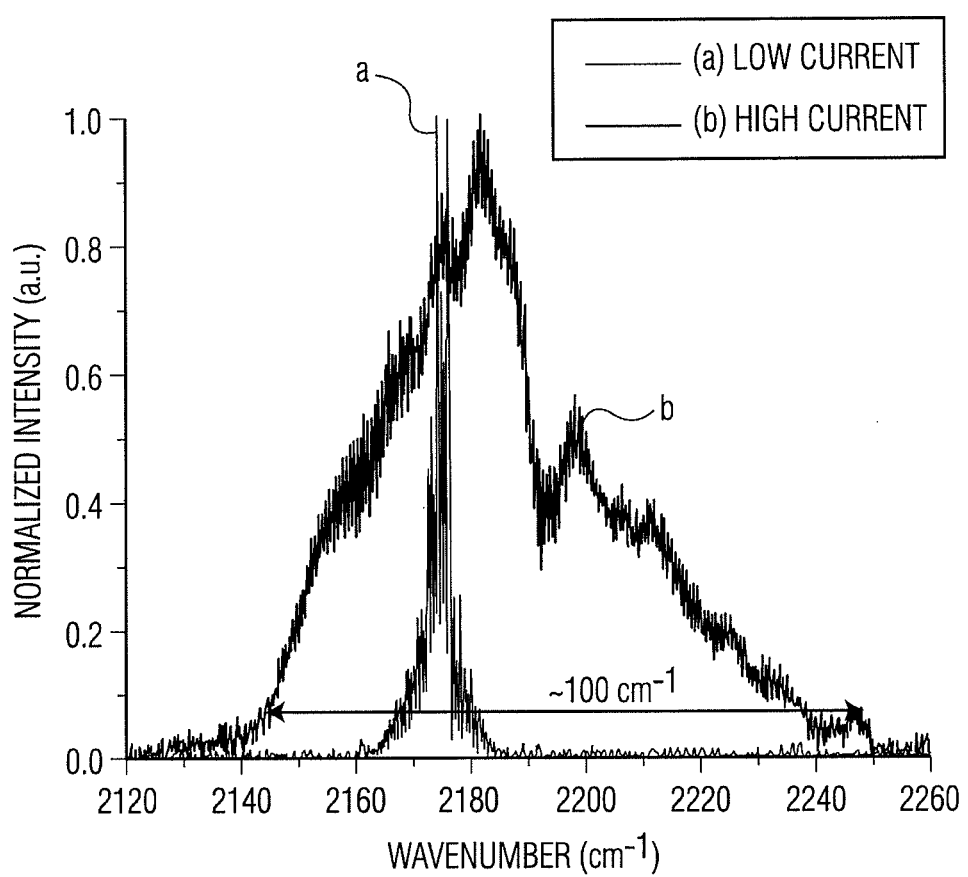

FIG. 8 is a graph plotting wavenumber and normalized intensity characteristics of a laser fabricated in accordance with the geometry shown in FIG. 1 and described herein. Results using low and high current levels are plotted.

Figure 9A:
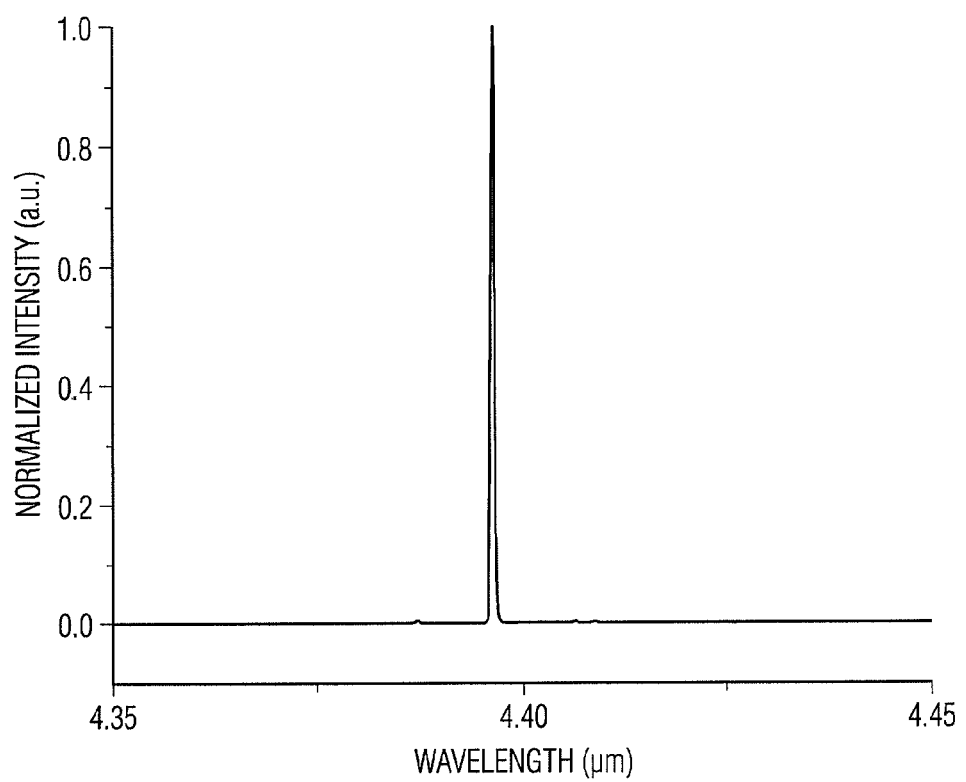
Figure 9B:
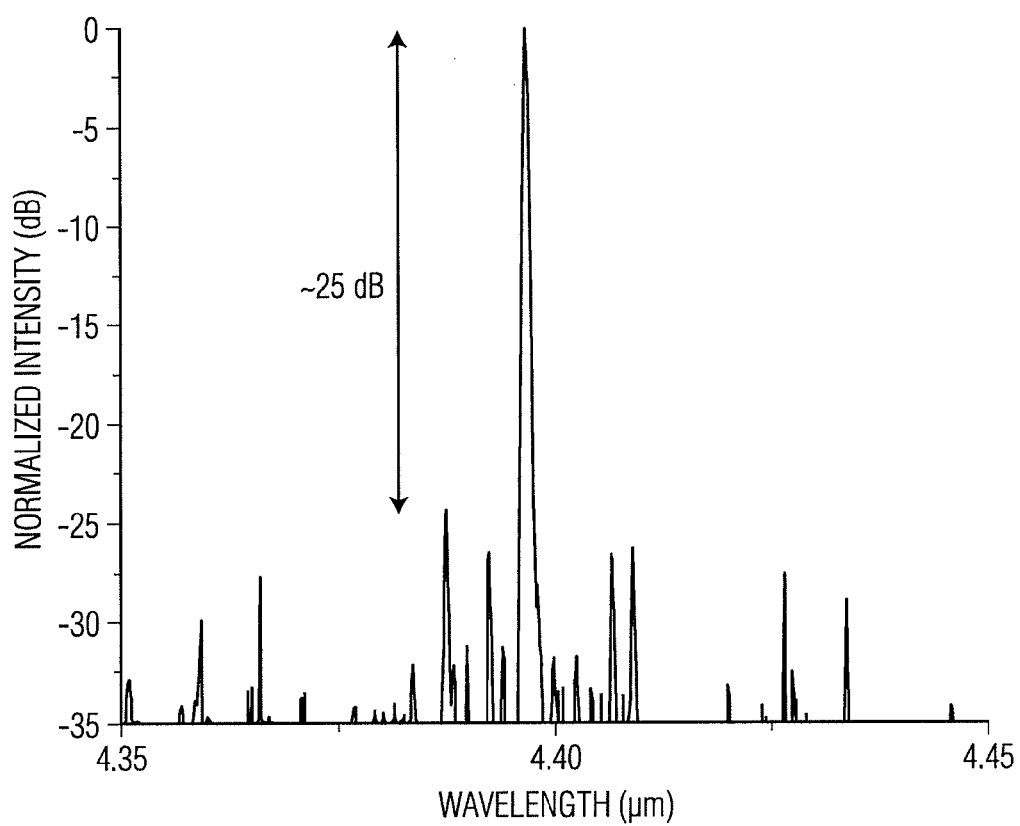

FIGS. 9A-9B are graphs showing single-mode emission achieved by of lasers fabricated in accordance with the geometry shown in FIG. 1 and described herein, using different bending diameters for the curved segment 16 (including 50 µm, 75 µm, 100 µm, and 125 µm, measured from the center of the ridges (straight segments 14a, 14b)). SMSR of up to approximately 25 dB was achieved (80 K, pulsed).

The graphs shown in FIGS. 10A-10B illustrate single-mode operation current ranges of greater than 600 mA that were achieved using lasers fabricated in accordance with the geometry shown in FIG. 1 and described herein (operated at 80 K, in pulsed mode). The ridge length was 1.22 mm, and the bending diameter was 50 µm. A single-mode device yield (15 dB) of 56% (23 of 41) was achieved for devices having bending diameters of 50 µm, and 45% (6 of 14) for devices having bending diameters of 75 µm.

FIGS. 11A-11B are graphs showing voltage and current responses of a laser fabricated in accordance with the geometry shown in FIG. 1 and described herein, versus a laser using conventional FP cavity designs. The response characteristics of the laser in accordance with the present invention are shown in FIG. 11A. It can be seen that the current density of the laser of the present invention is 3 to 5 times than that of conventional FP cavity lasers.

Figure 12A:
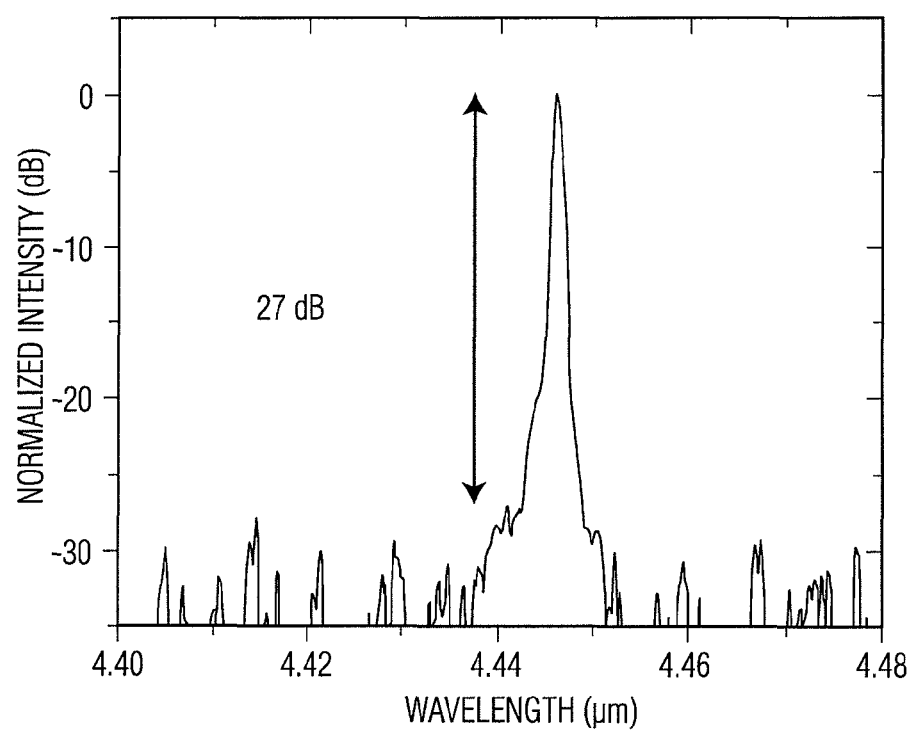

FIG. 12A is a graph showing performance characteristics of a laser fabricated in accordance with the geometry shown in FIG. 1 and described herein, wherein the straight segments 14a, 14b have lengths of 1.18 mm each and the curved segment has a diameter of 100 µm.

Figure 12B:
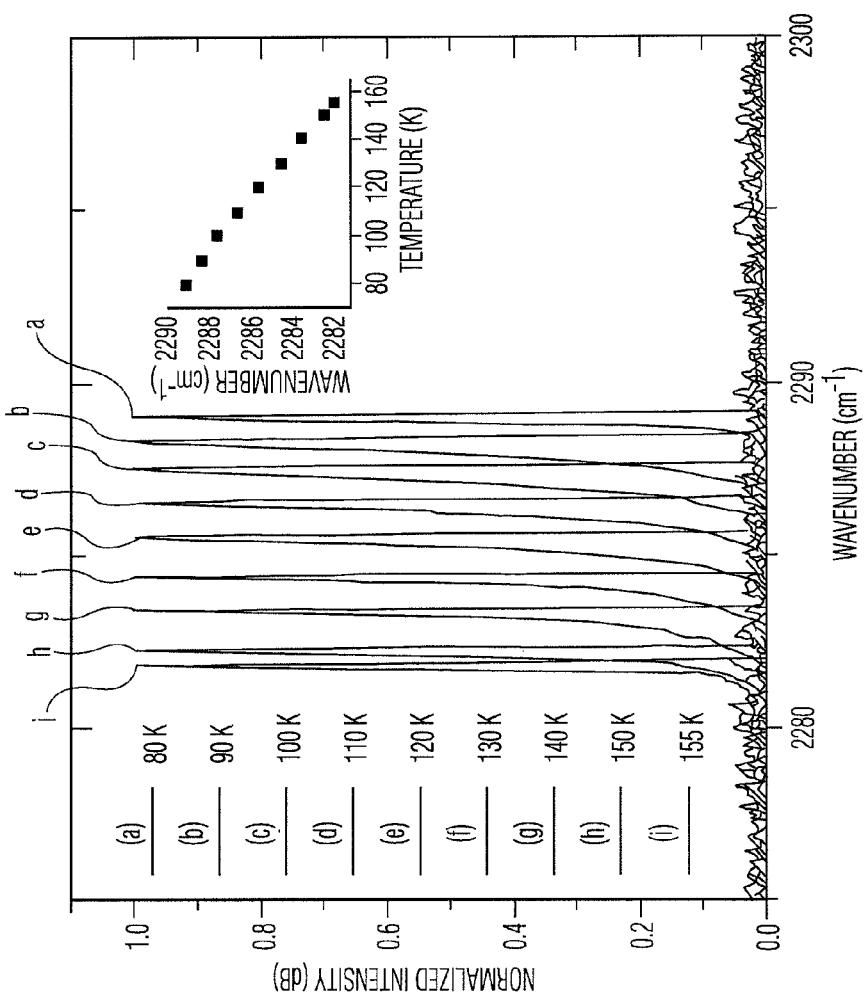
Figure 12C:
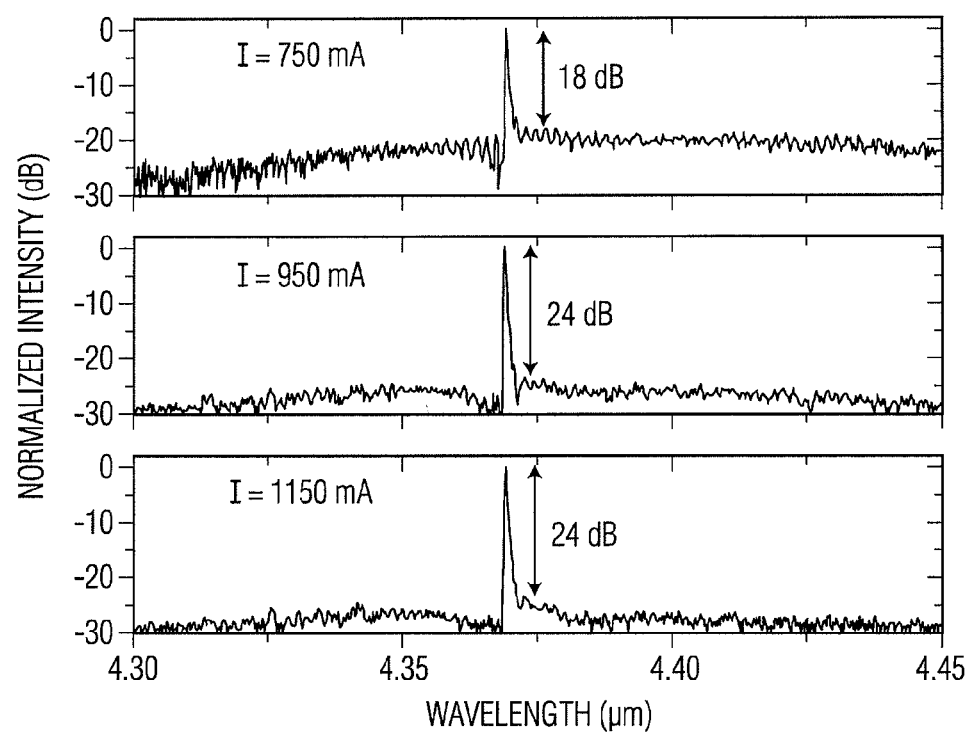

Shown in FIG. 12B-12C are performance characteristics and temperature-induced tuning of a laser fabricated in accordance with the geometry shown in FIG. 3A and described herein, wherein the straight segment 114 has a length of 1.23 mm and the curved segment 116 has a 360 degree turn with diameters of 105 µm for the first half-ring and 75 µm for the second half-ring. At 80 K, the laser operates in single mode up to approximately 500 mA (approximately 70%) above threshold current (Ith=740 mA) with a side-mode suppression ratio (SMSR) of approximately 25 dB (FIG. 12B). Over 7 cm$^{-1}$ mode-hop free tuning is achieved by varying the operating temperature from 80 K to 155 K (FIG. 12C). As can be appreciated, in order to accurately achieve a target molecular absorption line for certain real applications, the emission wavelength the lasers disclosed herein can be tuned with the combination of tailoring the geometry of the cavity (e.g., the length of the straight sections and/or the curvatures of the half-ring or spiral sections) and tuning the operating temperature.

Figure 13A:
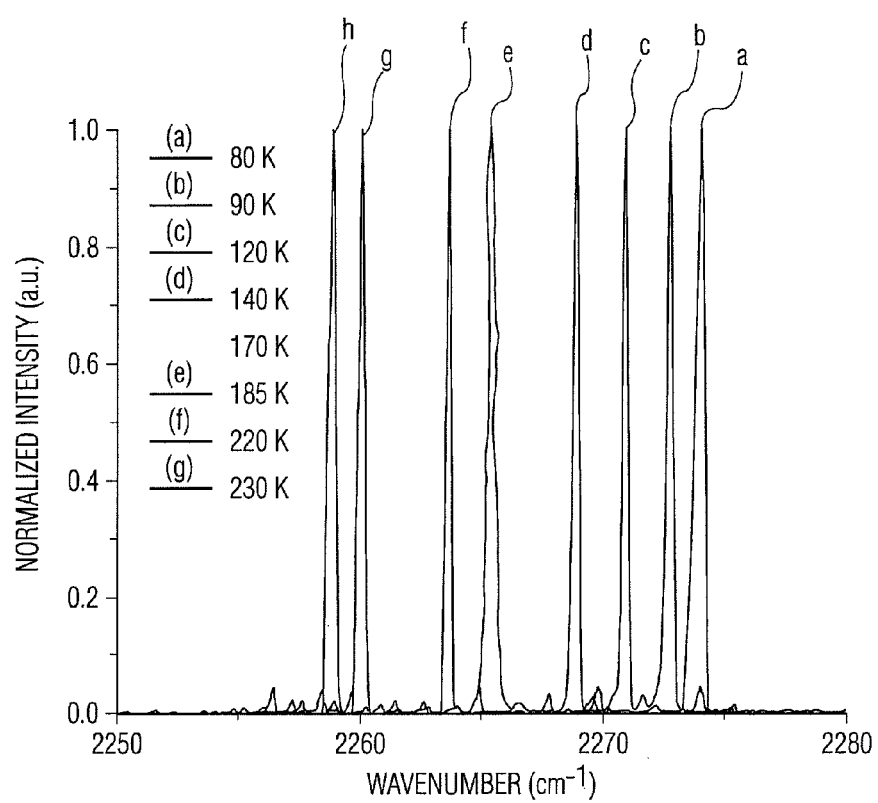
Figure 13B:
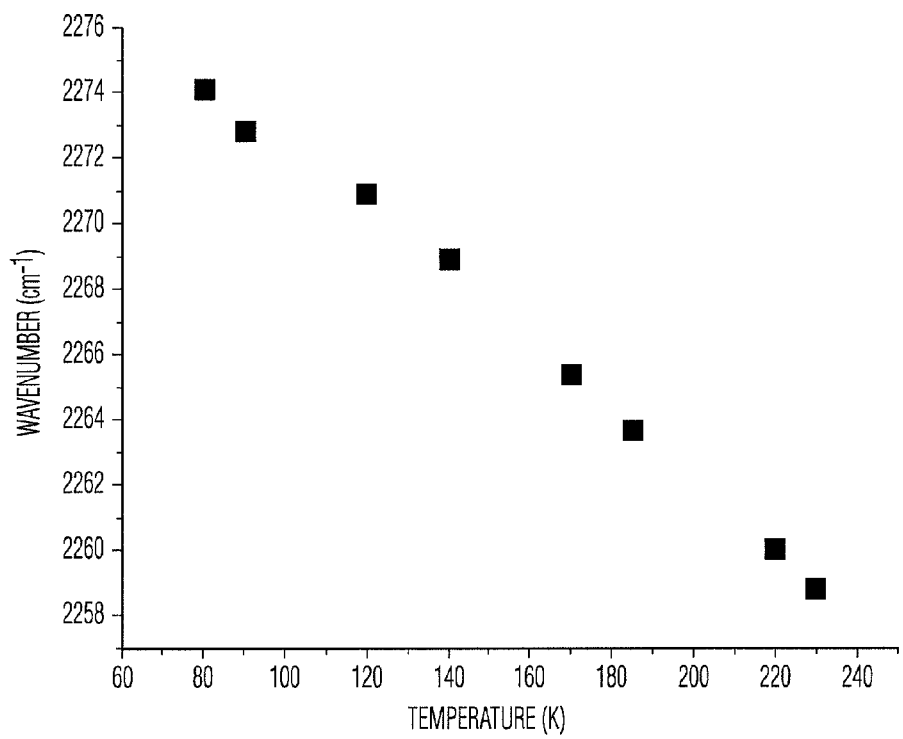

FIGS. 13A-13B are graphs showing performance of a laser fabricated in accordance with the geometry shown in FIG. 1 and described herein, at different temperatures (80 K to 230 K). As can be seen, different temperatures affect tuning of the device at different wavelengths. From temperatures of 80 K to 230 K, a tuning range of approximately 15 cm$^{-1}$ was achieved. To achieve the results shown in FIGS. 13A-13B, the laser included a ridge length of 1225 µm and a curved segment having a diameter of 50 µm.

Figure 14:
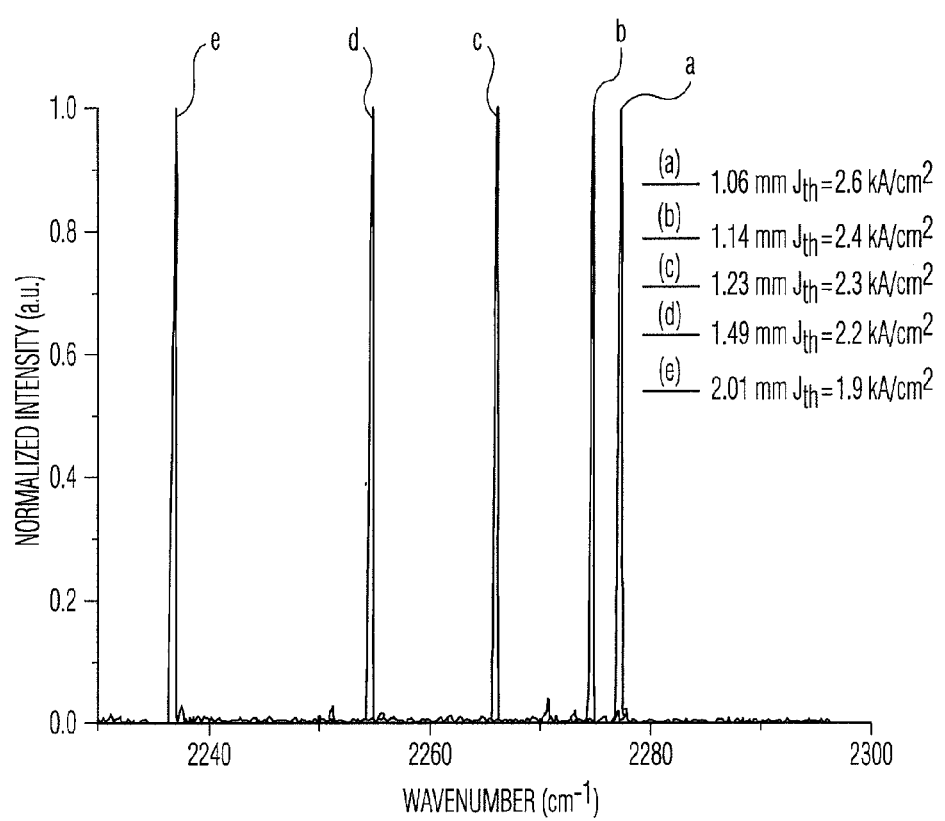

FIG. 14 is a graph showing performance of lasers fabricated in accordance with the geometry shown in FIG. 1 and described herein, wherein various lengths (e.g., 1.06 mm, 1.14 mm, 1.23 mm, 1.49 mm, and 2.01 mm, respectively) are provided for the straight segments (ridges) 14a, 14b. In each case, the curved segment 16 had a diameter of 50 µm. As can be appreciated, by changing the lengths of the ridges of the laser, the device can be tuned to desired wavelengths. Further, changing the curvature of the curved segment 16 also affects tuning of the device.

Additional performance characteristics of lasers fabricated in accordance with the geometry shown in FIG. 1 and described herein are shown in FIGS. 15A-15B. Laser spectra at various currents above threshold (as shown in the top three graphs in FIG. 15A) in comparison with that of a straight FP resonator waveguide laser (as shown in the bottom graph in FIG. 15A) of similar cavity length (2.5 mm) are illustrated. FIG. 15B illustrates the results of FIG. 15A normalized and plotted in log scale, with approximately 20 dB SMSR. Laser spectra were measured at 80 K with a Fourier Transform Infrared Spectrometer. The lasers were operated in pulsed mode with pulse width of 20 ns and repetition rate of 80 kHz. FIGS. 15A-15B show the spectral measurement results of a laser with half-ring inner diameter of ~75 µm and straight ridge length of ~1.2 mm. The laser was operated in single mode up to approximately 400 mA above threshold current ($I_{th}$=1.1 A) with a side-mode suppression ratio (SMSR) of ~20 dB. All the tested devices (including all four different half-ring inner diameters) demonstrated either single mode operation within a similar current range above threshold or had only a few modes, whereas a straight FP resonator waveguide laser from the same design with similar ridge length (~2.5 mm) and cross-section had tens of longitudinal modes within the similar current range above threshold. The threshold current density of these folded FP resonator waveguide lasers was four times greater than that of the straight FP resonator waveguide lasers and the slope efficiency was also considerably decreased.

Having thus described the invention in detail, it is to be understood that the foregoing description is not intended to limit the spirit or scope thereof. What is desired to be protected is set forth in the following claims.

What is claimed is:

1. A single-mode laser comprising:
a substrate;
a shaped cavity formed on the substrate from a plurality of epitaxial layers, the shaped cavity including a plurality of straight segments and a curved segment connected to ends of the plurality of straight segments, one of the plurality of straight segments forming a first spectral mode filter for propagating light in a first plurality of modes, the curved segment forming a second spectral mode filter for propagating light in a second plurality of modes, and the plurality of straight segments and the curved segment together forming a monolithic coupled cavity, wherein the first plurality of modes and the second plurality of modes couple into each other to create reflection and to emit a single wavelength of light; and
a plurality of electrical contacts connected to the substrate and the shaped cavity,
wherein laser light is generated in the shaped cavity and emitted at ends of the plurality of straight segments of the shaped cavity opposite the curved segment.

2. The laser of claim 1, wherein the single-mode laser comprises a quantum cascade laser.

3. The laser of claim 1, wherein the shaped cavity comprises a monolithic coupled resonator.

4. The laser of claim 1, wherein the shaped cavity comprises a folded Fabry-Perot resonator.

5. The laser of claim 1, wherein the curved section has a constant width.

6. The laser of claim 1, wherein the curved section includes at least one flat wall.

7. The laser of claim 1, wherein each of the plurality of straight segments includes an angled inner wall defining a tapered width.

8. The laser of claim 1, wherein each of the plurality of straight segments includes an angled outer wall defining a tapered width.

9. The laser of claim 1, wherein the plurality of epitaxial layers comprises alternating layers of Indium Gallium Arsenide and Indium Aluminum Arsenide.

10. The laser of claim 1, wherein the curved segment of the shaped cavity is curved 180 degrees.

11. A single-mode laser comprising:
a substrate;
a shaped cavity formed on the substrate from a plurality of epitaxial layers, the shaped cavity including a straight segment and a curved segment connected to one end of the straight segments, the straight segment forming a first spectral mode filter for propagating light in a first plurality of modes, the curved segment forming a second mode filter for propagating light in a second plurality of modes, and the straight segment and the curved segment together forming a monolithic coupled cavity, wherein the first plurality of modes and the second plurality of modes couple into each other to create reflection and to emit a single wavelength of light; and
a plurality of electrical contacts connected to the substrate and the shaped cavity,
wherein laser light is generated in the shaped cavity and emitted at an opposite end of the straight segment of the shaped cavity.

12. The laser of claim 11, wherein the single-mode laser comprises a quantum cascade laser.

13. The laser of claim 11, wherein the shaped cavity comprises a monolithic coupled resonator.

14. The laser of claim 11, wherein the shaped cavity comprises a Fabry-Perot resonator.

15. The laser of claim 11, wherein the shaped cavity has a spiral shape.

16. The laser of claim 11, wherein the shaped cavity is tapered in width toward one end of the curved segment.

17. The laser of claim 11, wherein the plurality of epitaxial layers comprises alternating layers of Indium Gallium Arsenide and Indium Aluminum Arsenide.

18. A single-mode laser comprising:
a substrate;
a shaped cavity formed on the substrate from a plurality of epitaxial layers, the shaped cavity including a first folded segment interconnected with a second folded segments, each of the first and second folded segments including a straight segment forming a first spectral mode filter for propagating light in a first plurality of modes, and a curved segment forming a second spectral mode filter for propagating light in a second plurality of modes, and the first and second folded segments together forming a monolithic coupled cavity, wherein the first plurality of modes and the second plurality of modes couple into each other to create reflection and to emit a single wavelength of light; and
a plurality of electrical contacts attached to the substrate and the shaped cavity,
wherein laser light is generated in the shaped cavity and emitted at an end of at least one of the first folded segment and the second folded segment.

19. The laser of claim 18, wherein laser light is emitted from ends of both the first folded segment and the second folded segment.

20. The laser of claim 18, wherein the single-mode laser comprises a quantum cascade laser.

21. The laser of claim 18, wherein the shaped cavity comprises a monolithic coupled resonator.

22. The laser of claim 18, wherein the shaped cavity comprises a Fabry-Perot resonator.

23. The laser of claim 18, wherein the plurality of epitaxial layers comprises alternating layers of Indium Gallium Arsenide and Indium Aluminum Arsenide.

24. The single-mode laser of claim 1, wherein the second plurality of modes are whispering gallery modes.

25. The single-mode laser of claim 11, wherein the second plurality of modes are whispering gallery modes.

26. The single-mode laser of claim 18, wherein the second plurality of modes are whispering gallery modes.

27. A single-mode laser comprising:
a substrate;
a shaped cavity formed on the substrate from a plurality of epitaxial layers, the shaped cavity including a straight segment and a curved segment connected to one end of the straight segments, the straight segment forming a first spectral mode filter, the curved segment forming a second spectral mode filter, and the straight segment and the curved segment together forming a monolithic coupled cavity, emitting a single wavelength of light; and
a plurality of electrical contacts connected to the substrate and the shaped cavity,
wherein laser light is propagated in whispering gallery modes in the curved segment and emitted at an opposite end of the straight segment of the shaped cavity.

28. The single-mode laser of claim 27, wherein the first spectral mode filter propagates light in a first plurality of modes and the second spectral mode filter propagates light in a second plurality of modes, and wherein the first plurality of modes and the second plurality of modes couple into each other to create reflection and to emit the single wavelength of light.

29. A single-mode laser comprising:
a substrate;
a shaped cavity formed on the substrate from a plurality of epitaxial layers, the shaped cavity including a first folded segment interconnected with a second folded segments, each of the first and second folded segments including a straight segment forming a first spectral mode filter and a curved segment forming a second spectral mode filter, and the first and second folded segments together forming a monolithic coupled cavity emitting a single wavelength of light; and
a plurality of electrical contacts attached to the substrate and the shaped cavity,
wherein laser light is propagated in whispering gallery modes in the curved segment and emitted at an end of at least one of the first folded segment and the second folded segment.

30. The single-mode laser of claim 29, wherein the first spectral mode filter propagates light in a first plurality of modes and the second spectral mode filter propagates light in a second plurality of modes, and wherein the first plurality of modes and the second plurality of modes couple into each other to create reflection and to emit the single wavelength of light.

* * * * *